United States Patent [19]
Pouzadoux

[11] 3,854,100
[45] Dec. 10, 1974

[54] PUSH-PULL AMPLIFYING DEVICES WITH CLASS D TRANSISTORIZED AMPLIFIERS

[75] Inventor: Jean Pouzadoux, Paris, France

[73] Assignee: Thomson-CSF, Paris, France

[22] Filed: Sept. 22, 1971

[21] Appl. No.: 182,689

[30] Foreign Application Priority Data
Oct. 2, 1970 France .............................. 70.35703

[52] U.S. Cl. .............. 330/15, 330/30 R, 330/207 A
[51] Int. Cl. ........................................................ H03f
[58] Field of Search ............... 307/202, 268, 1, 4, 8, 307/43, 75, 243, 262; 330/13, 15, 207 A, 207 P, 147, 17, 18, 30 R

[56] References Cited
UNITED STATES PATENTS

| | | | |
|---|---|---|---|
| 2,401,779 | 6/1946 | Swartzel, Jr. | 330/147 X |
| 3,469,173 | 9/1969 | Ohashi et al. | 307/268 X |
| 3,656,007 | 4/1972 | Murray | 307/262 |

*Primary Examiner*—Herman Karl Saalbach
*Assistant Examiner*—Lawrence J. Dahl
*Attorney, Agent, or Firm*—Cushman, Darby & Cushman

[57] ABSTRACT

In a push-pull amplifying device comprising two transistorized class D amplifiers, the input signal of each of these amplifiers is formed by the superposition of two in-phase waves, one of which is a sine wave and the other a rectangular one, the sine wave signal providing most of the input current required to ensure saturation during the conductive periods and in particular in the centre part of these periods.

3 Claims, 6 Drawing Figures

PUSH-PULL AMPLIFYING DEVICES WITH CLASS D TRANSISTORIZED AMPLIFIERS

The present invention relates to improvements in push-pull amplifying devices with class D amplifier transistors, and more particularly to high-frequency power amplifying devices with a selective load circuit.

Those skilled in the art will be aware that the use of semiconductors, in particular in power amplifiers, requires strict observance of their maximum operating conditions, that is to say, in particular, of the instantaneous peak values of voltage applied to the collectors of the transistors, of the current flowing through them and of the dissipated power.

It is well known to limit the instantaneous peak voltages and currents by the use of threshold devices, conventionally these are diodes, which generally operate satisfactorily.

The limitation of the dissipated power is more difficult and is often achieved indirectly by acting upon the root causes of its exceeding the limit, for example by checking the standing wave ratio of the amplifier load.

In the case of class D amplifiers, which, by definition, operate alternately in the blocked and saturated conditions in the rythm of the positive and negative alternations of the signal to be amplified, maximum efficiency is obtained from the amplifiers by making the fronts of the input signals as steep as possible. The result is then, at the start of the unblocking of the transistor, when the voltage applied to its collector is still close to the maximum, and at the end of the conduction phase, peak transient currents occur which can cause an overstepping of the safe area and a secondary breakdown process.

The object of the present invention is to remedy this drawback.

In accordance with the invention, there is provided a push-pull amplifying device comprising two transistorized class D amplifiers supplying a load circuit resonant at the frequency of the signal to be amplified and having respective inputs, first and second input terminals for respectively receiving said signal in the form of two rectangular waves having opposite phases, a third input terminal for receiving said signal in the form of a sine wave having the same phase as the rectangular wave applied to said first input terminal, a fourth input terminal for receiving said signal in the form of a sine wave having the same phase as that of the rectangular wave applied to said second input terminal, a first adding circuit coupling said first and third input terminals to said input of one of said two amplifiers, and a second adding circuit coupling said second and fourth input terminals to said input of the other one of said two amplifiers.

In accordance with the invention, there is further provided a device for generating a high frequency sine wave having a predetermined frequency, said generating device comprising an amplifying device as described hereinabove, the load circuit of which is resonant at said frequency; means for applying two rectangular waves having said frequency and opposite phases respectively to said first and second input terminals of said amplifying device, and means for applying two sine waves having said frequency and opposite phases respectively to said third and fourth terminals, the waves applied to said first and third terminals having the same phase.

The invention will be better understood and others of its features rendered apparent, from a consideration of the description and the appended drawings attached hereto, in which.

Figure 1:
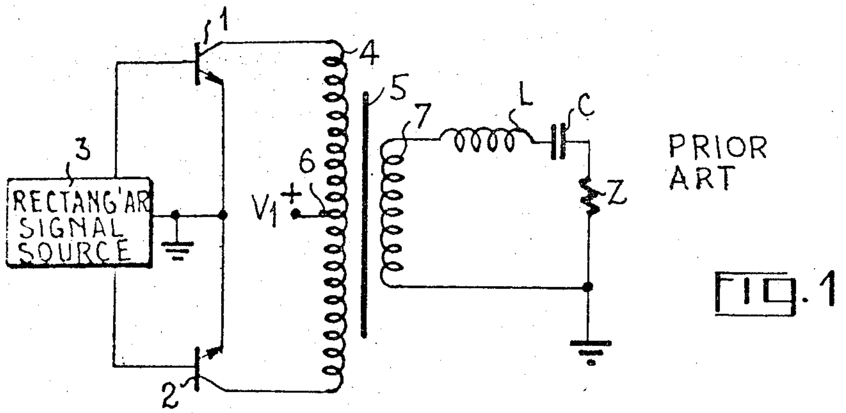
FIG. 1 is a block diagram of a prior art amplifier fed in a conventional way.

In FIG. 1, the bases of two n-p-n transistors 1 and 2 respectively receive two rectangular wave signals, of opposite phases, delivered by a current source 3. The emitters of the transistors are grounded as also is the centre-tap of the source 3. Their collectors are connected to the ends of the primary 4 of a transformer 5 whose centre-tap 6 is supplied with a positive voltage $V_1$.

The secondary 7 supplies a load impedance Z across an inductance L and a capacitor C.

Figure 2:
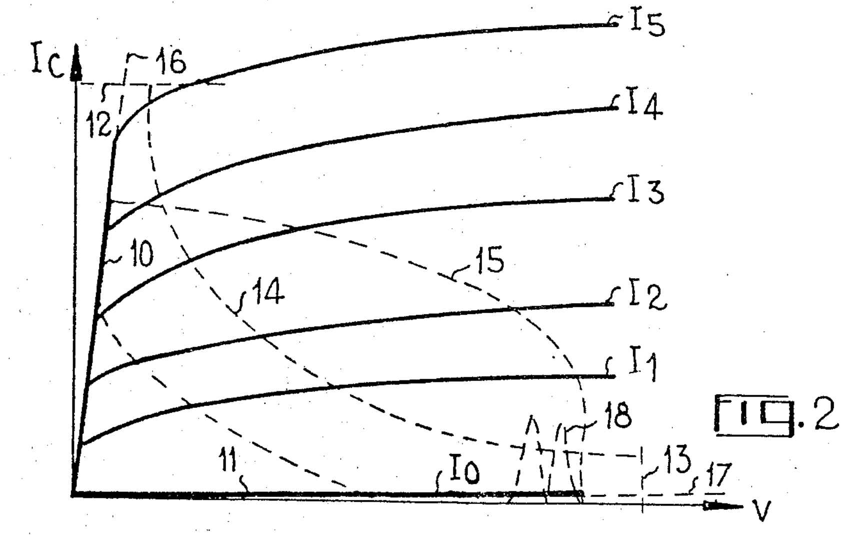
FIGS. 2 and 3 are explanatory diagrams.
Figure 3:
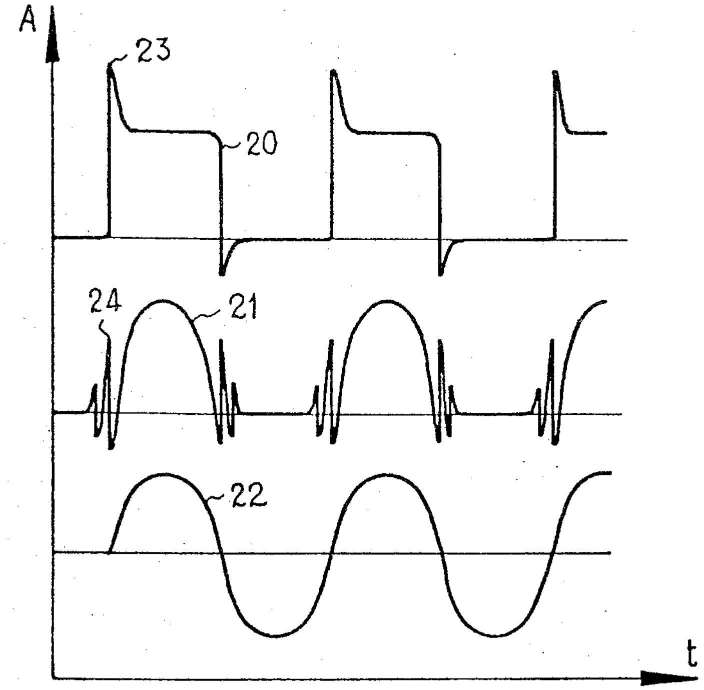

The operation of this amplifier will be better understood from a consideration of FIGS. 2 and 3.

In FIG. 2, graphs showing the variation of the collector current $I_c$ of a transistor as a function of the collector voltage V, for different values $I_o$ to $I_5$, where $I_o = 0$, of the current flowing through the emitter-base junction, are plotted.

If the source 3 produces signals of sufficiently high level to saturate the transistor 1 and 2 during the positive alternations of these signals, and if the frequency of the signals corresponds to the resonance frequency of the load circuit L C Z, then, as those skilled in the art will be aware, the operating characteristic of each transistor will be represented by the straight lines 10 and 11 of FIG. 2, so that the transistors can be likened to contact breakers which are alternately open and closed, one operating along the line 10 whilst the other operates along the line 11, and vice-versa.

In order not to destroy the transistors, it is necessary for their operating diagram to remain within the limits represented in FIG. 2 by the straight line 12, this corresponding to the peak collector current which must not be exceeded, by the straight line 13 representing the peak collector voltage, and by the hyperbolic arm 14, representing the peak instantaneous power dissipated $P_M(= V = I_c)$, which must not be exceeded. The limits thus defined can be accidentally exceeded by the switching diagram, for a variety of reasons. For example, a reactive load will proudce a diagram such as 15 which intersects the limit curve 14; too low a load resistance will cause the limit 12 to be exceeded by the extension of the straight line 10 at 16; a resistance becoming abruptly very high (open-circuit for example) will cause the limit 13 to be exceeded by the extension of the straight line 11 at 17. Equally, however, transient and pulse overshoots, such as that marked 18, will occur at the instant when the transistor passes from the blocked to the conductive condition, or vice versa. The appearance of such transient phenomena is due to the fact that in order to make such transitions as short as possible with a view to approaching the ideal theoretical efficiency of 100 percent, an input signal having very steep fronts is used.

FIG. 3 illustrates the amplitude A as a function of the time $t$, , for the current 20 flowing through the base of the transistor 1, for the collector current, 21, of the transistor 1 and for the current 22 flowing through the load Z (FIG. 1). The latter is the resultant, filtered by the L C circuit, of the current 21 and an identical current which is the current from the transistor 2, reversed in phase by the transformer 5.

Looking at the curve 20, a peak 23 can be seen in the current flowing through the transistor base as the latter starts to conduct, the collector current then commencing to in accordance with a sinusoidal law, said peak base current being disproportionate in relation to the requirements of saturation at the time, hence the disturbances in the collector current 24, corresponding to transitory overshoots of the above-mentioned limits.

Figure 4:
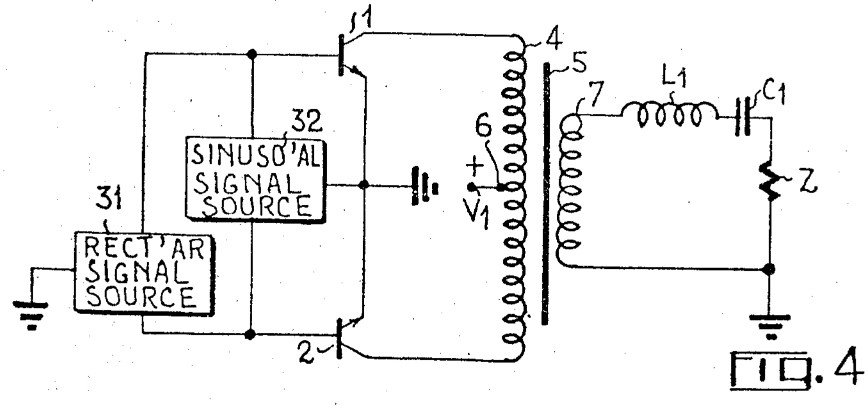
FIG. 4 is a schematic diagram illustrating the principle of a wave generating device in accordance with the invention.

These faults are corrected by the device in accordance with the invention which is described hereinafter:

FIG. 4, in which references which are the same as those used in FIG. 1 designate the same elements, is a block diagram differing from that of FIG. 1 in that the source 3 is replaced by two parallel-connected current sources 31 and 32; the source 31 applying to the bases of the two transistors, two rectangular wave signals having opposite phase, and the source 32 applying to each base a sine wave signal having the same frequency and phase as the rectangular signal applied thereto by the source 31.

Figure 5:
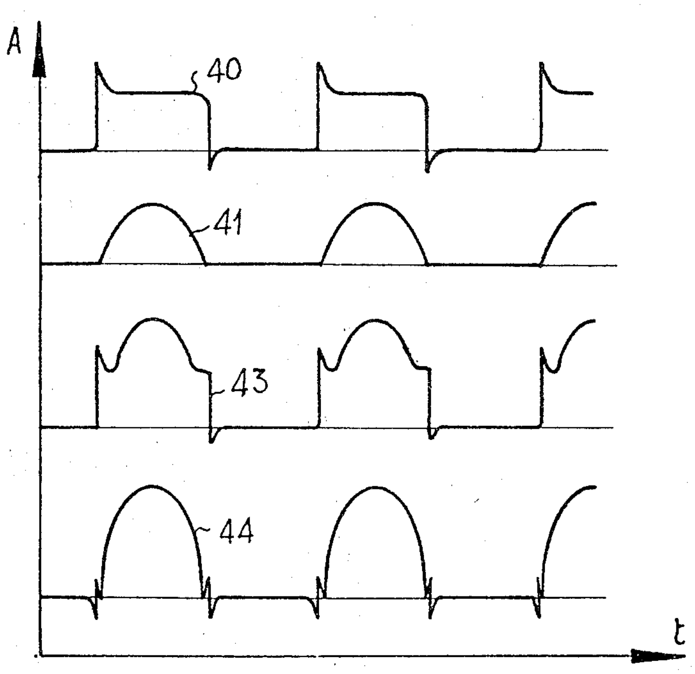
FIG. 5 is an explanatory diagram.

The operation of this new arrangement will be better understood from a consideration of FIG. 5 where different signals concerning the transistor 1 have been shown as a function of time. The curve 41 shown the base current supplied to this transistor by the source 32. The curve 40 represents the current supplied by the generator 31, but at a much larger scale, for the legibility of the figure, this current being similar to that produced by the source 3 of FIG. 1, but of much smaller magnitude. The curve 43 is the sum of the two aforesaid curves and the curve 44 is that of the collector current of the same transistor 1.

This new arrangement enables the peak base current to be limited, at the times of change of state, to a reasonable value while ensuring adequate saturation. Most of the current required to ensure saturation during the conductive period, and in particular at the centre part of this period, is achieved by the source 32 which must, of course, operate in perfect synchronism with the source 31. The result of this novel arrangement, as curve 44 shows when compared with curve 21 of FIG. 3, is a very substantial reduction in the magnitude of the transient phenomena and therefore in the risk of the limiting operating conditions being exceeded.

A more detailed example of the implementation of the above devices, is described hereinafter.

As results from the description of FIG. 4 the signal to be amplified must be applied to the amplifying device both under the form of a sine wave and of a rectangular wave and conversely being both conventional steps, this raises no problem.

Figure 6:
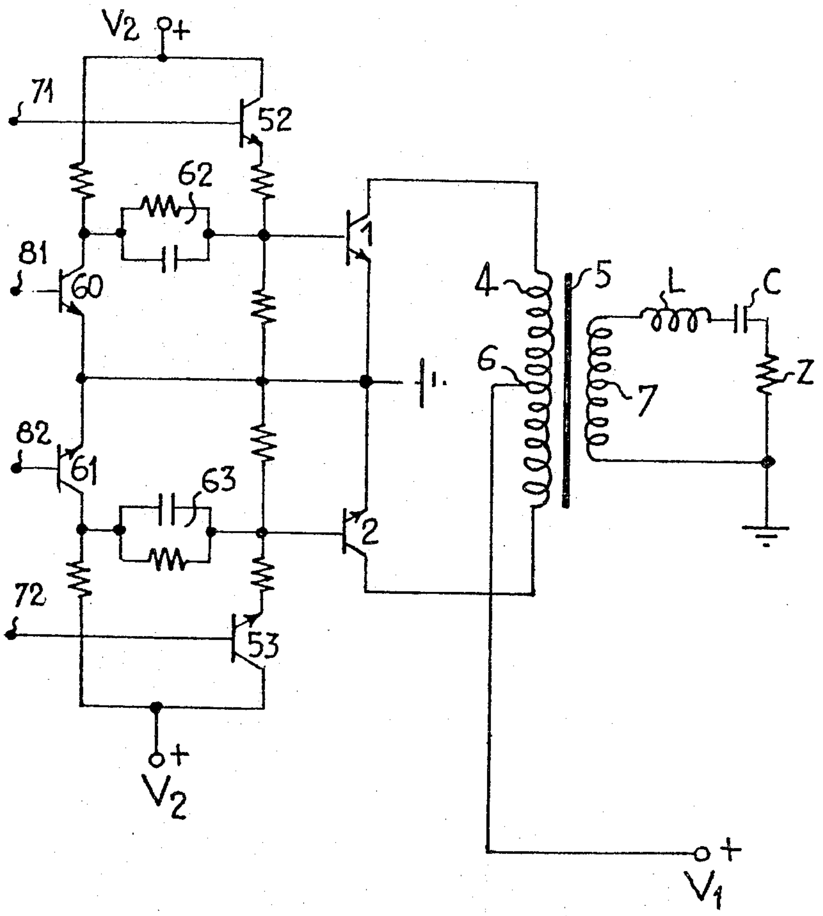
FIG. 6 is a diagram of an embodiment of an amplifying device in accordance with the invention.

The amplifying device shown in FIG. 6, all the transistors of which are of the n-p-n type, has a first pair of input terminals 71 and 72 to which the sine wave signal is applied with opposite phases, and a second pair of input terminals 81 and 82 to which the corresponding rectangular signal is applied with opposite phases, and this so that the signals applied to terminals 71 and 81 be in phase opposition.

The terminal 71 is connected to the base of a transistor 52 whose collector is connected to a positive voltage source $V_2$ and whose emitter is connected to ground through two serially mounted resistors, the common terminal of which is connected to the base of the class D amplifying transistor 1.

The terminal 72 is coupled to the base of the class D amplifying transistor 2 through an identical circuit, the transistor of which is designated by the number 53.

The transistors 52 and 53 operate in class B in order to preserve the sinusoidal shape of their input signals.

The terminal 81 is connected to the base of a transistor 60, the emitter of which is grounded and the collector of which is connected to the source of voltage $V_2$ through a resistor, and to the base of the transistor 1 through a differentiating circuit 62 comprising a resistance in parallel with a capacitor.

The terminal 82 is coupled to the base of the transistor 2 by an identical circuit, the transistor and the differentiating circuit of which are respectively designated by the numbers 61 and 63.

The transistors 60 and 61 operate in class D.

The bias connection of the transistors 52, 53, 60 and 61 have not been shown in the drawing.

The operation of the device is a follows:

The circuit, the inputs of which are the terminals 71 and 81, applies to the base of the transistor 1 the sum of the signals applied to these two terminals (disregarding a constant gain for each of these signals) and the circuit, the inputs of which are the terminals 72 and 82, operates in the same way for the signals applied to these terminals and the feeding of the base of the transistor 2.

The purpose of the differentiating circuits 62 and 63 is to increase the rapidity of the switching through making steeper the fronts of the rectangular signals, as shown by the curve 40 of FIG. 5.

The precise amplitude ratio between the input rectangular and sine wave signals for an optimum operation depends upon the parameters of the circuit and may be adjusted experimentally.

On the base of each one of the transistors 1 and 2, the peak magnitude of the sine wave current should be much higher than the peak magnitude of the rectangular wave current; according to the characteristics of these transistors, the optimum ratio will generally be found to lie between 20 and 30.

At the present state of the art, the maximum power which transistors can carry, is often less than the desired power, which means that a certain number of them have to be operated in parallel. The arrangements described are just as readily applicable to the case where the transistors 1 and 2 are each replaced by the same number of similar transistors. However, it is desirable to connect the emitter of each transistor individually to earth, across a resistor, this ensuring an equal distribution of currents and imposing substantially identical loads on each transistor.

What is claimed is:

1. A push-pull amplifying device comprising first and second transistorized class D amplifiers having respective inputs; a common resonant load circuit for said amplifiers; and adding means for applying to each of said inputs of said amplifiers with opposite phases, a sum signal formed by the sinusoidal signal to be amplified and a rectangular signal having the same frequency and phase as this sinusoidal signal.

2. A push-pull amplifying device as claimed in claim 1 wherein said adding means comprise first and second resistor adding circuits, said first resistor adding circuit having first and second inputs for respectively receiving the rectangular signal and the sinusoidal signal forming the sum signal applied to said input of said first amplifier, and an output coupled to said input of said first amplifier, said second resistor adding circuit having first and second inputs for respectively receiving the rectangular signal and the sinusoidal signal forming the sum signal applied to said input of said second amplifier, and an output coupled to said input of said second amplifier.

3. A push-pull amplifying device, wherein said adding means further comprising: first and second transistorized class D amplifiers; a common resonant load circuit for said amplifiers; first and second resistor adding circuits, for applying to each of said amplifiers with opposite phases a sum signal formed by the sinusoidal signal to be amplified and a rectangular signal having the same frequency and phase as this sinusoidal signal, said adding circuits having respective outputs and respective first and second inputs; first and second transistors having outputs electrodes respectively coupled to said first and second inputs of said first resistor adding circuit for respectively preamplifying the rectangular and sinusoidal signals to be applied to said last mentioned inputs; third and fourth transistors having output electrodes respectively coupled to said first and second inputs of said second resistor adding circuit for respectively preamplifying the rectangular and sinusoidal signals to be applied to said last mentioned inputs; said first resistor adding circuit comprising a differentiating circuit connected between said first input and said output of said first resistor adding circuit and said second resistor adding circuit comprising a differentiating circuit connected between said first input and said output of said second resistor adding circuit.

* * * * *